United States Patent
Sun et al.

(10) Patent No.: US 10,365,328 B2
(45) Date of Patent: Jul. 30, 2019

(54) REGISTER ARRAY HAVING GROUPS OF LATCHES WITH SINGLE TEST LATCH TESTABLE IN SINGLE PASS

(71) Applicant: GLOBALFOUNDRIES INC., Grand Cayman (KY)

(72) Inventors: Jian Sun, Shanghai (CN); Chao Meng, Shanghai (CN); Xiaoxiao Li, Shanghai (CN); Yinpeng Lu, Shanghai (CN)

(73) Assignee: GLOBALFOUNDRIES INC., Grand Cayman (KY)

( * ) Notice: Subject to any disclaimer, the term of this patent is extended or adjusted under 35 U.S.C. 154(b) by 64 days.

(21) Appl. No.: 15/636,793

(22) Filed: Jun. 29, 2017

(65) Prior Publication Data

US 2019/0004114 A1    Jan. 3, 2019

(51) Int. Cl.
| | |
|---|---|
| *G01R 31/00* | (2006.01) |
| *G01R 31/3185* | (2006.01) |
| *G11C 29/30* | (2006.01) |
| *G06F 11/22* | (2006.01) |
| *H03K 19/177* | (2006.01) |
| *H03K 19/173* | (2006.01) |
| *G11C 29/12* | (2006.01) |
| *G11C 29/32* | (2006.01) |

(52) U.S. Cl.
CPC ........ *G01R 31/318536* (2013.01); *G01R 31/318505* (2013.01); *G06F 11/2205* (2013.01); *G11C 29/12015* (2013.01); *G11C 29/30* (2013.01); *G11C 29/32* (2013.01); *H03K 19/1735* (2013.01); *H03K 19/1776* (2013.01); *G11C 2029/3202* (2013.01)

(58) Field of Classification Search
None
See application file for complete search history.

(56) References Cited

U.S. PATENT DOCUMENTS

| | | | |
|---|---|---|---|
| 4,961,013 A | * | 10/1990 | Obermeyer, Jr. ............. G01R 31/318572 326/16 |
| 5,130,568 A | * | 7/1992 | Miller ................. H03K 3/0375 324/750.3 |
| 5,717,700 A | * | 2/1998 | Crouch .......... G01R 31/318536 714/726 |
| 5,783,960 A | * | 7/1998 | Lackey .......... G01R 31/318552 327/256 |
| 7,170,328 B2 | | 1/2007 | Dhong et al. |
| 7,234,090 B2 | | 6/2007 | Blasi et al. |

(Continued)

*Primary Examiner* — Daniel F. McMahon
(74) *Attorney, Agent, or Firm* — Gibb & Riley, LLC; Michael J. LeStrange, Esq.

(57) ABSTRACT

A register array includes a plurality of groups of latches. Each of the groups of latches includes a first latch, a second latch, and a test latch connected to the first latch and the second latch. During functional operation the first latch and the second latch process data, in response to the same read/write clock signal supplied simultaneously to the first read/write clock input and the second read/write clock input. During test operation a skewed test clock signal of an original test clock signal is supplied at different timings to the first latch, the second latch, and the test latch, and a single scan signal is input to the first latch. The single scan signal cascades from the first latch through the test latch to the second latch, and is output by the second latch, within a single cycle of the original test clock signal.

18 Claims, 5 Drawing Sheets

(56) References Cited

U.S. PATENT DOCUMENTS

| | | | |
|---|---|---|---|
| 7,237,163 B2* | 6/2007 | Dhong | G06F 11/267 |
| | | | 714/726 |
| 7,425,855 B2 | 9/2008 | Chen et al. | |
| 7,482,851 B2 | 1/2009 | Lackey et al. | |
| 7,661,047 B2* | 2/2010 | Rickert | G01R 31/318533 |
| | | | 326/10 |
| 7,908,534 B2 | 3/2011 | Motika et al. | |
| 8,423,844 B2 | 4/2013 | Gillis et al. | |
| 8,635,503 B2 | 1/2014 | Tang et al. | |
| 2003/0126533 A1* | 7/2003 | McAdams | G01R 31/318536 |
| | | | 714/727 |
| 2006/0041802 A1* | 2/2006 | Grise | G01R 31/318541 |
| | | | 714/724 |
| 2010/0313090 A1* | 12/2010 | Tanaka | G01R 31/318541 |
| | | | 714/731 |
| 2014/0298126 A1* | 10/2014 | Sugiyama | G01R 31/318541 |
| | | | 714/726 |

* cited by examiner

REGISTER ARRAY HAVING GROUPS OF LATCHES WITH SINGLE TEST LATCH TESTABLE IN SINGLE PASS

BACKGROUND

Field of the Invention

The present disclosure relates to electronic memories, and more specifically, to register arrays that use groups of latches.

Description of Related Art

Conventional scannable register array structures include a plurality of individual latches, each configured to hold one bit of array data in a normal mode of operation. The individual latches operate in scannable groups of latches in test mode, where first latches of the scannable groups of latches are L1 latches, and second latches of the scannable groups of latches are L2 latches. A test clock signal generates a first clock pulse signal, A, for the L1 latches and a subsequent second clock pulse signal, B, for the L2 latches.

The L2 latches are further configured to selectively receive L1 data therein, upon a separate activation of the B clock signal, independent of the test clock signal, such that a scan out operation of the individual latches results in observation of L1 latch data. However, this needs a specific test sequence to first shift-out data within the L2 latch. Thus, an additional test clock is required to move the data from the L1 stage to the L2 stage. A second pass of the scan shift is required to have data within L1 be observed at the tester through the scan output. This two pass scan, and the additional test clock between the two scan operation (to move data from L1 to L2) makes this testing not fully compatible with mux-scanning (where a multiplexor is placed at the input of each flip-flop in such a way that all flip-flops can be connected in a shift register for multiplexor selection) and thus less useful with industry standards.

Other register arrays use scannable flip-flops (two latches per memory data bit; one data bit, one test bit). The testing of such register arrays uses existing standard scan techniques where each latch pair (L1/L2) is shifted with each scan cycle, and only the L2 latches are normally visible, because only one of the latches is a test latch and the other is a data latch. In essence, the latch pair operates together as a scannable flop that appears to sequence on the rising edge of CLK, and presents data to the register array scan out pin on the falling edge of CLK. Thus, a scanout sequence will appear to observe the contents of each memory data bit. However, such structures increase the area requirement per bit for the register array, by using two latches for each memory data bit.

SUMMARY

Various register arrays herein include, among other components, multiple 2×2 bit kernels groups of latches connected in a cascaded manner to form multi-bit (e.g., 8-bit, 16-bit, 32-bit, etc.) words of memory. Each of the 2×2 bit kernels includes two (2-bit) cells, and each of the cells has a first latch, a second latch, and a test latch. The first latch and the second latch each comprise a separate memory bit. The first latch and the second latch are physically symmetrical.

For example, the first latch can have a first data input, a first read/write clock input, a first test clock input, and a scan signal input; the second latch can have a second data input, a second read/write clock input, a second test clock input, and a scan signal output; and the test latch can have a third test clock input. During functional operation, the first latch and the second latch process data through the first data input and the second data input, respectively, in response to the same read/write clock signal supplied simultaneously to the first read/write clock input and the second read/write clock input.

During test operation, a skewed test clock signal of an original test clock signal is supplied at different timings to the first test clock input of the first latch, the second test clock input of the second latch, and the third test clock input of the test latch; and a single scan signal is input to the scan signal input of the first latch. The skewed test clock signal is supplied first to the test latch, secondly to the first latch, and lastly to the second latch, without overlap between an active pulse clock signal portion. The first latch and the second latch are connected to the test latch to cause the single scan signal to cascade from the first latch through the test latch to the second latch, and be output by the scan signal output of the second latch, to use the single test clock and the single scan signal to test both the first latch and the second latch within a single cycle of the original test clock signal.

With such devices, a 2×2 kernel has a first cell that has two first latches connected on opposite sides of a first test latch, and a second cell that has two second latches connected on opposite sides of a second test latch; and such cells are electrically connected to one another through various "cascade" connections. A first cascade connection supplies the single scan signal from a first input latch of the first cell to the first test latch, a second cascade connection supplies the single scan signal from the first test latch to a first output latch of the first cell, a third cascade connection supplies the single scan signal from the first output latch to a second input latch of the second cell, a fourth cascade connection supplies the single scan signal from the second input latch to the second test latch, and a fifth cascade connection supplies the single scan signal from second test latch to a second output latch of the second cell.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
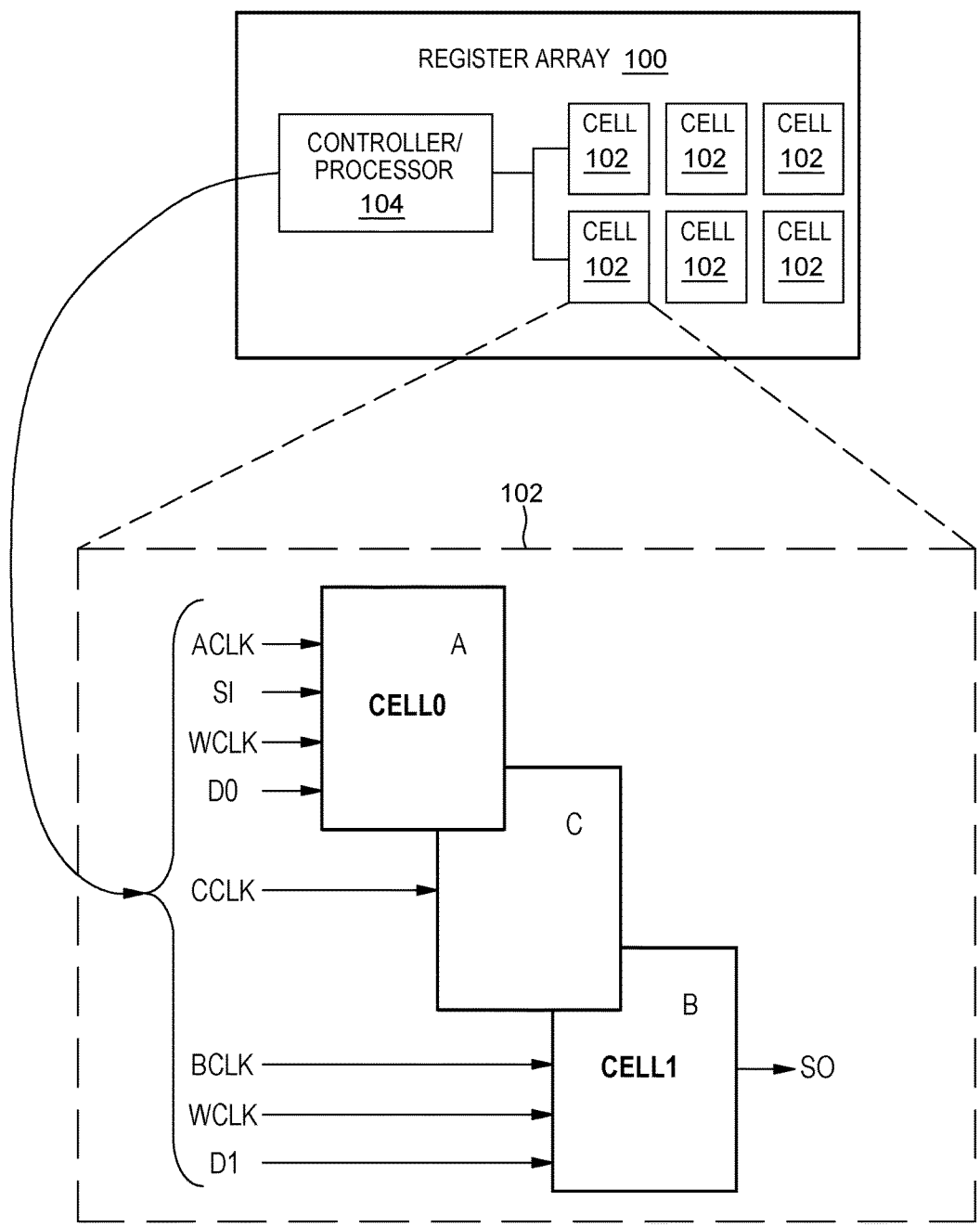
FIG. 1 is a schematic diagram illustrating a bitcell unit e according to embodiments herein.

As shown above, register arrays that use one latch per data bit use multiple clock cycles to test each latch, which makes the testing longer. Register arrays that use two latches per data bit (one data latch, one test latch) reduce testing time by testing different data bits using the same clock signal cycle; however, because these register arrays use two latches per data bit, this doubles the area per bit occupied by the register array. The devices described herein address these issues by using the same clock signal cycle to test multiple data bits (to achieve faster testing) by providing a register array structure that includes only a single test latch for every pair of data latches. Therefore, structures herein use three latches for every two data bits (or 1.5 latches per data bit). Thus, the structures herein provide faster testing than the one latch per data bit register arrays (by simultaneously testing both data bits of groups of latches in the same clock pulse); but uses less area per bit compared to register arrays that use two latches per data bit (by only using 1.5 latches per data bit).

The register array (RA), with scannable level-sensitive scan design (LSSD) latches as bitcells, occupies a memory size window of the chip area menu. While latch based bitcells are easily integrated into LSSD style scan chains for testing, it becomes difficult to test register arrays when the rest of the chip is designed with mux-scan registers (which is accepted as an industry standard). On one hand, scannable LSSD latches (L1/L2) cannot be treated as two separate scan bits in a mux-scan, which means data in L1 will be lost during mux-scanning operations. On the other hand, testing the register array as a macro creates an additional test mode, which means more test time and test overhead.

The structures described herein resolve these problems of testing register arrays with a mux-scan design. With the disclosed bitcell structures, the register array can be tested in compliance with mux-scan based scan test methodology. To be more specific: each scannable LSSD latch based bitcell of the disclosed register array discussed below can be connected to a mux-scan chain; a single test clock is used for the register array to do a scan shift; one scan enable signal is used to switch the register array between functional and scan mode; and every effective memory bit of the register array can be shift out from SI to SO with a one-pass scan operation.

The structures described herein significantly reduce the register array's test complexity and test time, and thus provide testing structures that are more cost effective. With these structures, every effective memory bit of the register array can be shifted out with a one-pass scan operation, where a single test clock is used for the scan shift. Meanwhile, since the register array can be tested in compliance with a scan-based test, no additional test mode is required.

The structures described herein further reduce the area of a register array with same capacity, which promotes the desirable dense memory. These structures use a single LSSD latch as bitcell, and add only one test latch for every two bitcells, to hold data during scanning. The equivalent bitcell size thus becomes 1.5× LSSD latch.

As shown in FIG. 1, a register array (RA) 100 can contain many memory cells 102, and can include (or be connected to) a controller or processor 104. One of the memory cells 102 is shown in expanded view in FIG. 1, and this illustrates that each memory cell or cell 102 includes two effective memory data bits using three latches: latch A and B for memory data bit storage; and latch C for testing only.

A test mode control pin, scan enable signal (SE), is supplied by the controller/processor 104 to cause the register array 100 to switch between functional and scan mode (test mode). In functional mode, SE is low, so the two-bit cell 102 performs read/write operations using a word clock (WCLK). Thus, in functional mode, latches A and B have data inputs D0/D1, and also receive WCLK from the controller/processor 104 to control the read/write process of the memory bit cells 102.

In scan (test) mode, SE strobes high, causing latches A-C to be controlled by different clock signals in a scan shift testing operation. In test mode, the scan channel of cell 102 starts from the SI of latch A, to the SI of latch C, to the SI of latch B, and ends with the SO of latch B. During such operations, latches A, B, and C receive three different clock signals: ACLK; BCLK; and CCLK, as their scan shift clocks, respectively.

Figure 2:
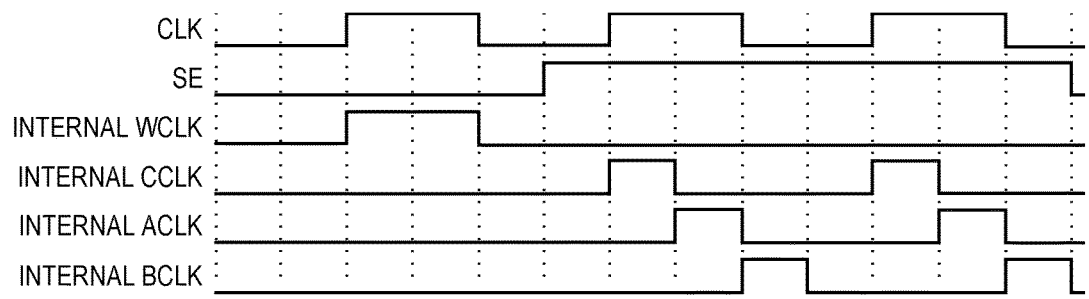
FIG. 2 is a schematic diagram illustrating clock waveforms of the device shown in FIG. 1.

FIG. 2 illustrates the clock waveforms of the scan shift operation occurring in the two-bit cell 102 shown in FIG. 1. A original test clock (CLK) is received from the controller/processor 104 during the scan shift process. Skewed clock signals ACLK, BCLK and CCLK are all generated from this original clock signal, CLK. Further, as shown in FIG. 2, ACLK, BCLK and CCLK are non-overlapping clock signals; and therefore, the rising edge of CCLK comes after the rising edge of CLK; the rising edge of ACLK comes after the trailing edge of CCLK; the rising edge of BCLK comes after the trailing edge of ACLK; and the trailing edge of BCLK comes before the next rising edge of CLK. In other words, there is no overlap between the active pulse of ACLK, BCLK and CCLK, as shown in FIG. 2.

Figure 3:
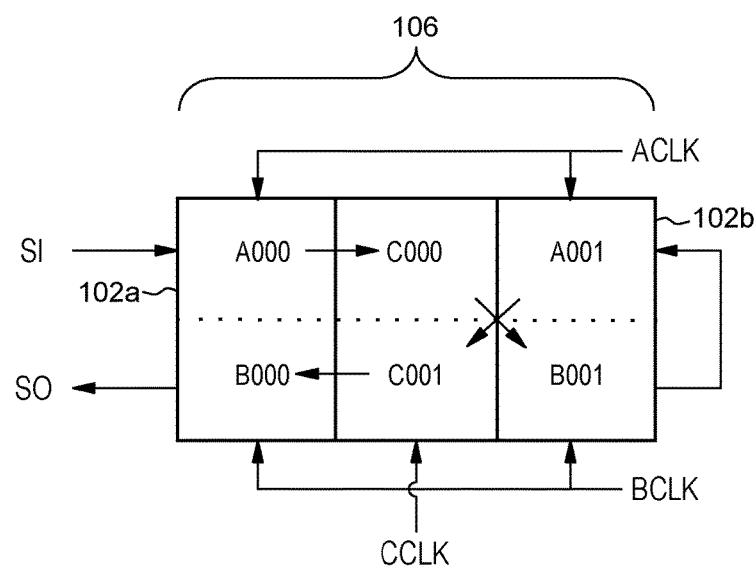
FIG. 3 is a schematic diagram illustrating a 2×2 repeatable kernel.

FIG. 3 schematically illustrates two of the two-bit cells 102 that form a physically symmetrical 2×2 bit kernel 106 of the register array 100. In the 2×2 kernel 106, the scan channel of the two-bit cell 102 is cascaded in the following order: from the scan input (SI)->A000 (cell 1)->C000 (cell 1)->B001 (cell 1)->A001 (cell 2)->C001 (cell 2)->B000 (cell 2)->to scan output (SO), as shown by the arrows in FIG. 3.

Figure 4:
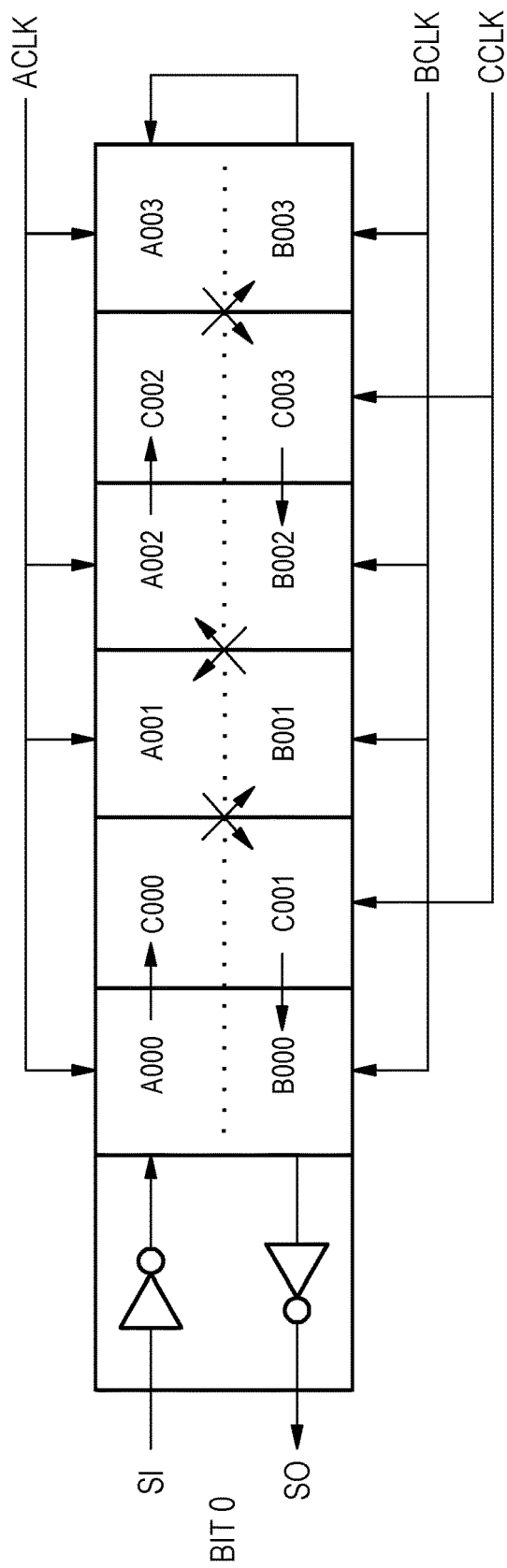
FIG. 4 is a schematic diagram illustrating an 8 bits register array.

By connecting the SO of one cell (e.g., cell 000) to the SI of next 2×2 kernel 106, and the SI of a different cell (e.g., cell 001) to SO of the next 2×2 kernel 106, multiple 2×2 kernels 106 can be cascaded, and the symmetrical structure can be expanded as needed (cells 002 & 003, etc.), as shown in FIG. 4. The example shown in FIG. 4 is of a register array 100 with two 2-bit cells 102 totaling four cells (cells 000-003; or 8 effective memory bits). If this structure is simply used in a latch name to name state, the structures have 8 bits of data A000, A001, A002, A003, B000, B001, B002 and B003 to be observed at SO with 8 CLK pulse of scan shift operation.

Figure 5:
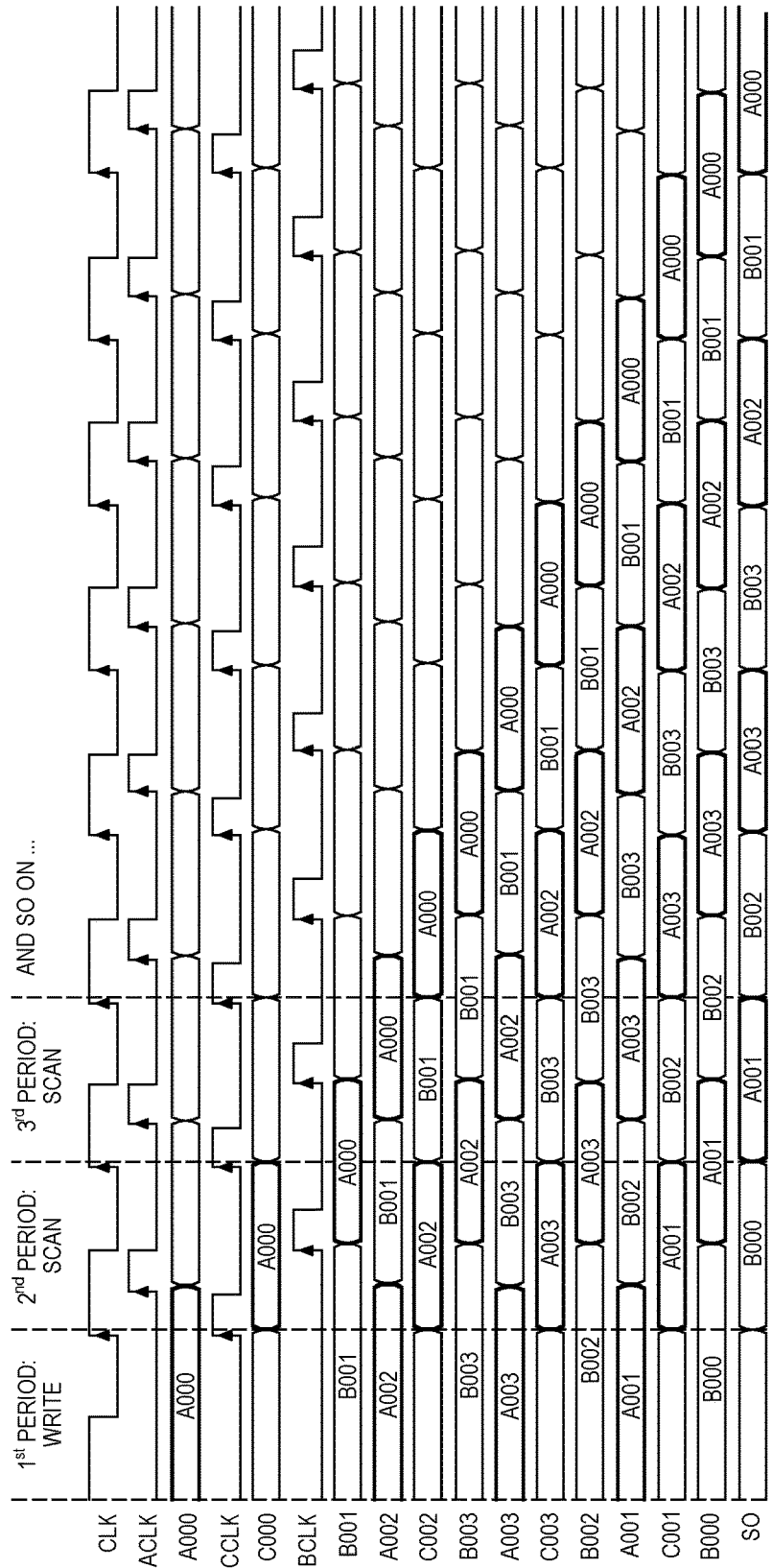
FIG. 5 is a timing diagram of a scan operation.

FIG. 5 is a timing diagram showing how the register array shown in FIG. 4 operates in scan mode. In FIG. 5, ACLK, BCLK, and CCLK operate as shown in FIG. 2. In this timing diagram, each effective memory bit of register array receives an initial state for scan out (e.g., during "$1^{st}$ period: write"). As also shown in FIG. 5, A000 is the last bit of data in the scan chain. In the first scan clock (CLK) cycle (e.g., during "$2^{nd}$ period: scan") data A000 is first moved to latch C000 by the CCLK pulse, then moved to latch B001 by the BCLK pulse. In the second scan clock (CLK) cycle (e.g., during "$3^{rd}$ period: scan") data A000 is first moved to latch A002 by the ACLK pulse, then moved to latch C002 by the CCLK pulse, and finally moved to latch B003 by the BCLK pulse. In the later scan clock (CLK) cycles (e.g., during "And so on . . . ") the scan clock cycle data A000 repeats a similar move, and is finally moved to latch B000 with the 8th BCLK pulse, and can be observed at SO. The other 7 bits of data flow in the scan chain just like data A000, as shown in FIG. 5. After eight clock cycles of scan operation, the structures can observe the data B000, A001, B002, A003, B003, A002, B001, and A000 in serial.

Figure 6:
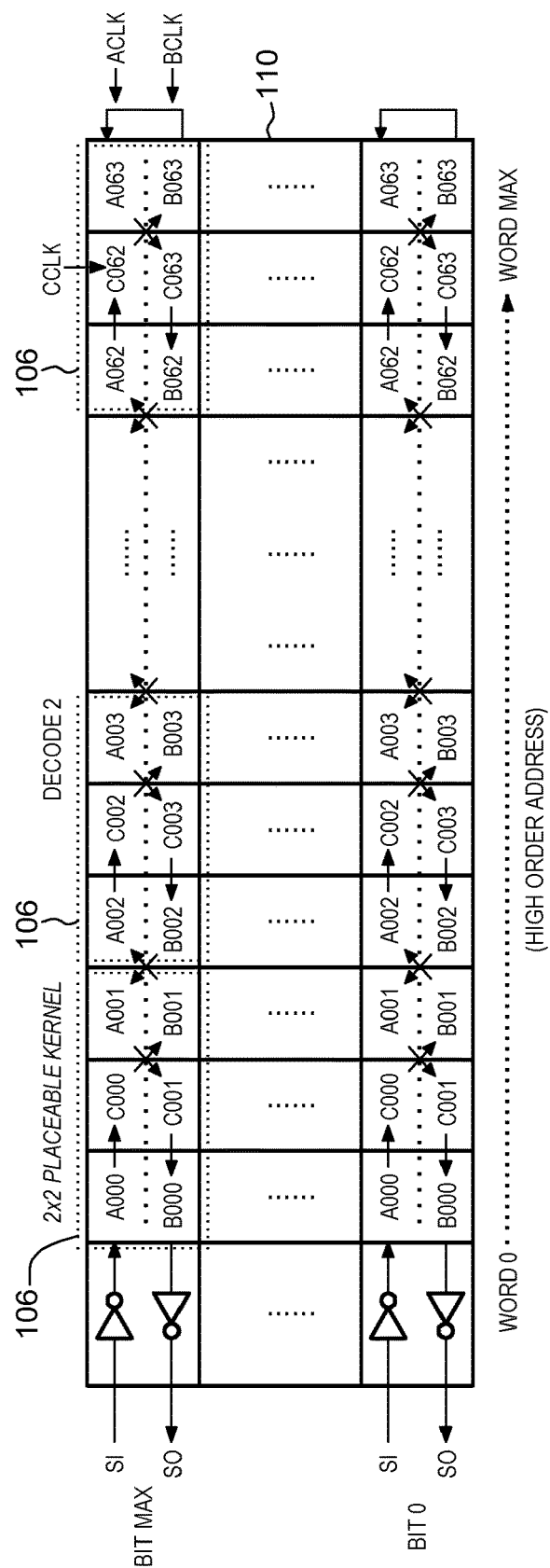
FIG. 6 is a schematic diagram illustrating a latch register array d its scan connections.

As shown in FIG. 6, the structures described herein, further expand the 2×2 kernel 106 structure, and combine multiple rows, to form a memory array 110, which is a structure of the two-bit cells 102, and its scan connections. Again, this structure provides faster testing than the one latch per data bit register arrays (by simultaneously testing both data bits of groups of latches in the same clock pulse);

but uses less area per bit compared to register arrays that use two latches per data bit (by only using 1.5 latches per data bit).

Thus, various register arrays 100 herein include, among other components, multiple 2×2 bit kernels 106 groups of latches connected in a cascaded manner to form multi-bit (e.g., 8-bit, 16-bit, 32-bit, etc.) words of memory 110. Each of the 2×2 bit kernels 106 includes two (2-bit) cells 102 that each have a first latch A, a second latch B, and a test latch C. The first latch A and the second latch B each comprise a separate memory bit, and thus, each 2×2 bit kernel has 4 bits of memory. The first latch A and the second latch B are physically symmetrical.

Again, the first latch A can have a first data input D0, a first read/write clock input WCLK, a first test clock input ACLK, and a scan signal input S1; the second latch B can have a second data input D1, a second read/write clock input WCLK, a second test clock input BCLK, and a scan signal output S1; and the test latch C can have a third test clock input CCLK.

During functional operation the first latch A and the second latch B process data through the first data input D0 and the second data input D1, respectively, in response to the same read/write clock signal WCLK supplied simultaneously to the first read/write clock input and the second read/write clock input WCLK.

During test operation a skewed test clock signal of an original test clock signal CLK is supplied at different timings to the first test clock input ACLK of the first latch A, the second test clock input BCLK of the second latch B, and the third test clock input CCLK of the test latch C; and a single scan signal S1 is input to the scan signal input S1 of the first latch A. For purposes of this disclosure "different timings" refers to intentional clock skew, which ensures that the same test clock signal arrives at the various latches at different times. Those skilled in art will recognize that such intentional clock skew can be achieved through the use of delay elements. The skewed test clock signal is supplied first to the test latch C, secondly to the first latch A, and lastly to the second latch B, without overlap between an active pulse clock signal portion. The first latch A and the second latch B are connected to the test latch C to cause the single scan signal S1 to cascade from the first latch A through the test latch C to the second latch B, and be output by the scan signal S1 output of the second latch B, to use the single test clock and the single scan signal S1 to test both the first latch A and the second latch B within a single cycle of the original test clock signal CLK.

More specifically, in FIG. 3, the first cell 102*a* has two first latches (A000 & B001) connected on opposite sides of a first test latch C000, the second cell 102*b* has two second latches (A001 & B000) connected on opposite sides of a second test latch C001, and such cells 102*a*-102*b* are electrically connected to one another through various "cascade" connections, that are shown as arrows between the boxes in FIG. 3. A first cascade connection supplies a single scan signal S1 from a first input latch A000 of the first cell 102*a* to a first test latch C000 of the first cell 102*a*, a second cascade connection supplies the scan signal S1 from the first test latch C000 to a first output latch B001 of the first cell 102*a*, a third cascade connection supplies the scan signal S1 from the first output latch B001 to a second input latch A001 of the second cell 102*b*, a fourth cascade connection supplies the single scan signal S1 from the second input latch A001 to a second test latch C001 of the second cell 102*b*, and a fifth cascade connection supplies the scan signal S1 from the second test latch C001 to a second output latch B000 of the second cell 102*b*.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Each respective figure, in addition to illustrating methods of and functionality of the present embodiments at various stages, also illustrates the logic of the method as implemented, in whole or in part, by one or more devices and structures.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A register array comprising:
   a plurality of groups of latches, each of the groups of latches comprises:
   a first latch;
   a second latch; and
   a test latch connected to the first latch and the second latch,
   during functional operation the first latch and the second latch process data, in response to a same read/write clock signal, and
   during test operation:
   a skewed test clock signal of an original test clock signal is supplied at different timings first to the test latch, secondly to the first latch, and lastly to the second latch;
   a single scan signal is input to the first latch; and
   the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal.

2. The register array according to claim 1, the skewed test clock signal is supplied first to the test latch, secondly to the first latch, and lastly to the second latch, without overlap between an active pulse clock signal portion.

3. A register array comprising:
   a plurality of groups of latches, each of the groups of latches comprises:
   a first latch;
   a second latch; and
   a test latch connected to the first latch and the second latch,
   during functional operation the first latch and the second latch process data, in response to a same read/write clock signal, and
   during test operation:
   a skewed test clock signal of an original test clock signal is supplied at different timings to the first latch, the second latch, and the test latch;
   a single scan signal is input to the first latch; and
   the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal,
   wherein the first latch and the second latch form a 2×2 bit kernel,
   wherein a first cell of the 2×2 bit kernel has two first latches connected on opposite sides of a first test latch, and
   wherein a second cell has two second latches connected on opposite sides of a second test latch.

4. The register array according to claim 3, the first latch and the second latch are physically symmetrical.

5. The register array according to claim 3, the first latch and the second latch each comprise a separate memory bit.

6. The register array according to claim 3, further comprising:
   a first cascade connection supplying the single scan signal from a first input latch of the first cell to the first test latch;
   a second cascade connection supplying the single scan signal from the first test latch to a first output latch of the first cell;
   a third cascade connection supplying the single scan signal from the first output latch to a second input latch of the second cell;
   a fourth cascade connection supplying the single scan signal from the second input latch to the second test latch; and
   a fifth cascade connection supplying the single scan signal from the second test latch to a second output latch of the second cell.

7. A register array comprising:
   a plurality of groups of latches, each of the groups of latches comprises:
   a first latch having a first data input, a first read/write clock input, a first test clock input, and a scan signal input;
   a second latch having a second data input, a second read/write clock input, a second test clock input, and a scan signal output; and
   a test latch having a third test clock input,
   during functional operation the first latch and the second latch process data through the first data input and the second data input, respectively, in response to a same read/write clock signal supplied simultaneously to the first read/write clock input and the second read/write clock input, and
   during test operation:
   a skewed test clock signal of an original test clock signal is supplied at different timings first to the third test clock input of the test latch, secondly to the first test clock input of the first latch, and lastly to the second test clock input of the second latch;
   a single scan signal is input to the scan signal input of the first latch; and
   the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal.

8. The register array according to claim 7, the skewed test clock signal is supplied first to the test latch, secondly to the first latch, and lastly to the second latch, without overlap between an active pulse clock signal portion.

9. A register array comprising:
   a plurality of groups of latches, each of the groups of latches comprises:
   a first latch having a first data input, a first read/write clock input, a first test clock input, and a scan signal input;

a second latch having a second data input, a second read/write clock input, a second test clock input, and a scan signal output; and a test latch having a third test clock input, during functional operation the first latch and the second latch process data through the first data input and the second data input, respectively, in response to a same read/write clock signal supplied simultaneously to the first read/write clock input and the second read/write clock input, and during test operation:
a skewed test clock signal of an original test clock signal is supplied at different timings to the first test clock input of the first latch, the second test clock input of the second latch, and the third test clock input of the test latch;

a single scan signal is input to the scan signal input of the first latch; and the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal wherein the first latch and the second latch form a 2×2 bit kernel, wherein a first cell of the 2×2 bit kernel has two first latches connected on opposite sides of a first test latch, and wherein a second cell has two second latches connected on opposite sides of a second test latch.

10. The register array according to claim 9, the first latch and the second latch are physically symmetrical.

11. The register array according to claim 9, the first latch and the second latch each comprise a separate memory bit.

12. The register array according to claim 9, further comprising:
a first cascade connection supplying the single scan signal from a first input latch of the first cell to the first test latch;
a second cascade connection supplying the single scan signal from the first test latch to a first output latch of the first cell;
a third cascade connection supplying the single scan signal from the first output latch to a second input latch of the second cell;
a fourth cascade connection supplying the single scan signal from the second input latch to the second test latch; and
a fifth cascade connection supplying the single scan signal from the second test latch to a second output latch of the second cell.

13. A register array comprising:
multiple 2×2 bit kernels connected in a cascaded manner to form a multi-bit word of memory;
each of the 2×2 bit kernels comprises two cells, and each of the cells comprises:
a first latch having a first data input, a first read/write clock input, a first test clock input, and a scan signal input;
a second latch having a second data input, a second read/write clock input, a second test clock input, and a scan signal output; and
a test latch having a third test clock input,
during functional operation the first latch and the second latch process data through the first data input and the second data input, respectively, in response to a same read/write clock signal supplied simultaneously to the first read/write clock input and the second read/write clock input, and during test operation:
a skewed test clock signal of an original test clock signal is supplied at different timings first to the third test clock input of the test latch, secondly to the first test clock input of the first latch, and lastly to the second test clock input of the second latch;
a single scan signal is input to the single scan signal input of the first latch; and
the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal.

14. The register array according to claim 13, the skewed test clock signal is supplied first to the test latch, secondly to the first latch, and lastly to the second latch, without overlap between an active pulse clock signal portion.

15. A register array comprising:
multiple 2×2 bit kernels connected in a cascaded manner to form a multi-bit word of memory;
each of the 2×2 bit kernels comprises two cells, and each of the cells comprises:
a first latch having a first data input, a first read/write clock input, a first test clock input, and a scan signal input;
a second latch having a second data input, a second read/write clock input, a second test clock input, and a scan signal output; and
a test latch having a third test clock input,
during functional operation the first latch and the second latch process data through the first data input and the second data input, respectively, in response to a same read/write clock signal supplied simultaneously to the first read/write clock input and the second read/write clock input, and during test operation:
a skewed test clock signal of an original test clock signal is supplied at different timings to the first test clock input of the first latch, the second test clock input of the second latch, and the third test clock input of the test latch to the first test clock input of the first latch, the second test clock input of the second latch, and the third test clock input of the test latch;
a single scan signal is input to the single scan signal input of the first latch; and
the first latch and the second latch are connected to the test latch to cause the single scan signal to cascade from the first latch through the test latch to the second latch, and be output by the second latch, to use a single test clock signal and the single scan signal to test both the first latch and the second latch within a single cycle of the original test clock signal,
wherein a first cell of each of the 2×2 bit kernels has two first latches connected on opposite sides of a first test latch, and
wherein a second cell has two second latches connected on opposite sides of a second test latch.

16. The register array according to claim 15, the first latch and the second latch are physically symmetrical.

17. The register array according to claim 15, the first latch and the second latch each comprise a separate memory bit.

18. The register array according to claim 15, further comprising:
- a first cascade connection supplying the single scan signal from a first input latch of the first cell to the first test latch;
- a second cascade connection supplying the single scan signal from the first test latch to a first output latch of the first cell;
- a third cascade connection supplying the single scan signal from the first output latch to a second input latch of the second cell;
- a fourth cascade connection supplying the single scan signal from the second input latch to the second test latch; and
- a fifth cascade connection supplying the single scan signal from the second test latch to a second output latch of the second cell.

* * * * *